(12) United States Patent
Abt

(10) Patent No.: US 7,928,838 B2
(45) Date of Patent: Apr. 19, 2011

(54) WHEEL ELECTRONICS AND TIRE CONTROL SYSTEM FOR MEASURING A MEASURAND

(75) Inventor: Christof Abt, Backnang (DE)

(73) Assignee: Atmel Automotive GmbH, Heilbronn (DE)

( * ) Notice: Subject to any disclaimer, the term of this patent is extended or adjusted under 35 U.S.C. 154(b) by 346 days.

(21) Appl. No.: 12/119,068

(22) Filed: May 12, 2008

(65) Prior Publication Data

US 2008/0278305 A1    Nov. 13, 2008

Related U.S. Application Data

(60) Provisional application No. 60/924,343, filed on May 10, 2007.

(30) Foreign Application Priority Data

May 10, 2007   (DE) .......................... 10 2007 021 859

(51) Int. Cl.
*B60C 23/00* (2006.01)
(52) U.S. Cl. ..... 340/442; 340/447; 340/505; 340/539.1; 340/10.1; 455/73; 455/106; 342/42
(58) Field of Classification Search .................. 340/442, 340/447, 505, 539.1, 10.1, 825.68, 10.3, 340/10.4, 10.41; 73/146.5; 342/42, 51, 44; 455/73, 106
See application file for complete search history.

(56) References Cited

U.S. PATENT DOCUMENTS

| | | | | |
|---|---|---|---|---|
| 3,861,211 A | * | 1/1975 | Dewan | 73/861.27 |
| 4,015,259 A | * | 3/1977 | Siverhus et al. | 342/44 |
| 4,064,482 A | * | 12/1977 | Maisch et al. | 340/444 |
| 4,155,095 A | * | 5/1979 | Kirschner | 348/701 |
| 4,219,821 A | * | 8/1980 | Selim | 342/445 |
| 4,360,927 A | * | 11/1982 | Bowen et al. | 455/17 |
| 4,409,687 A | * | 10/1983 | Berti et al. | 455/7 |
| 4,554,528 A | * | 11/1985 | Burkel et al. | 340/442 |
| 4,615,040 A | * | 9/1986 | Mojoli et al. | 375/267 |
| 4,764,769 A | * | 8/1988 | Hayworth et al. | 342/50 |
| 4,802,216 A | * | 1/1989 | Irwin et al. | 380/2 |
| 4,926,072 A | | 5/1990 | Hyodo | |
| 5,030,928 A | * | 7/1991 | Ho | 332/102 |
| 5,172,346 A | | 12/1992 | Wagner et al. | |
| 5,227,779 A | * | 7/1993 | Falck | 340/10.51 |
| 5,444,448 A | * | 8/1995 | Schuermann et al. | 342/42 |

(Continued)

FOREIGN PATENT DOCUMENTS

DE    100 14 076 A1    10/2001

(Continued)

*Primary Examiner* — George A Bugg
*Assistant Examiner* — Hoi C Lau
(74) *Attorney, Agent, or Firm* — Muncy, Gessler, Olds & Lowe, PLLC

(57) ABSTRACT

Wheel Electronics and Tire Control System for Measuring a Measurand is provided. The wheel electronics may include a receiving device for picking up and digitizing an amplitude-modulated request signal, which has a carrier frequency for encoding a request, having a first evaluation device, which checks the request signal for the presence of a request contained therein, and having a digital counter for generating an envelope of the request signal, which has a counter input for coupling the request signal, which is clocked at a clock signal frequency different from the carrier frequency and is determined from the clock signal frequency and the request signal of its envelope. Furthermore, the invention relates to a tire control system for measuring a measurand with this type of wheel electronics.

13 Claims, 5 Drawing Sheets

U.S. PATENT DOCUMENTS

| | | | |
|---|---|---|---|
| 5,548,291 A * | 8/1996 | Meier et al. | 340/10.34 |
| 5,811,998 A * | 9/1998 | Lundberg et al. | 327/156 |
| 6,417,642 B2 * | 7/2002 | Ichikawa | 318/638 |
| 6,434,194 B1 * | 8/2002 | Eisenberg et al. | 375/238 |
| 6,476,712 B1 | 11/2002 | Achterholt | |
| 6,531,957 B1 * | 3/2003 | Nysen | 340/10.1 |
| 6,809,567 B1 * | 10/2004 | Kim et al. | 327/160 |
| 7,224,269 B2 * | 5/2007 | Miller et al. | 340/444 |
| 7,236,464 B2 * | 6/2007 | Walker et al. | 370/295 |
| 7,385,477 B2 * | 6/2008 | O'Toole et al. | 340/10.2 |
| 2002/0084841 A1 | 7/2002 | Taguchi et al. | |
| 2002/0114406 A1 | 8/2002 | Mashimo | |
| 2003/0179024 A1 * | 9/2003 | Montagnana | 327/156 |
| 2005/0027604 A1 * | 2/2005 | Bandy et al. | 705/22 |
| 2006/0079190 A1 | 4/2006 | Ooba et al. | |
| 2006/0197655 A1 | 9/2006 | Luo et al. | |
| 2008/0150691 A1 * | 6/2008 | Knadle et al. | 340/10.1 |

FOREIGN PATENT DOCUMENTS

| | | |
|---|---|---|
| DE | 10 2006 003 825 A1 | 9/2006 |
| EP | 0 469 174 A1 | 2/1992 |
| GB | 1 147 552 | 4/1969 |
| JP | 64000813 | 1/1989 |
| JP | 1259617 | 10/1989 |

* cited by examiner

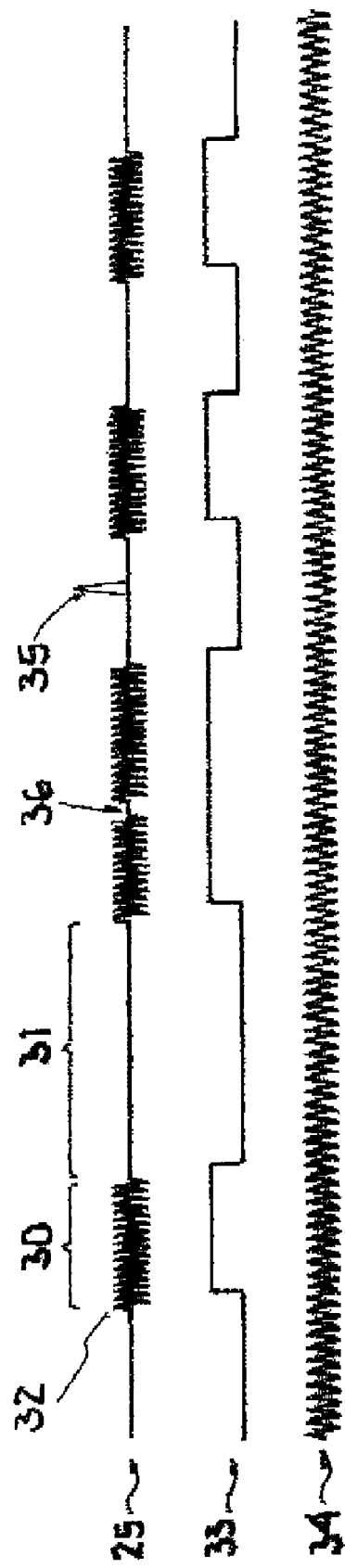

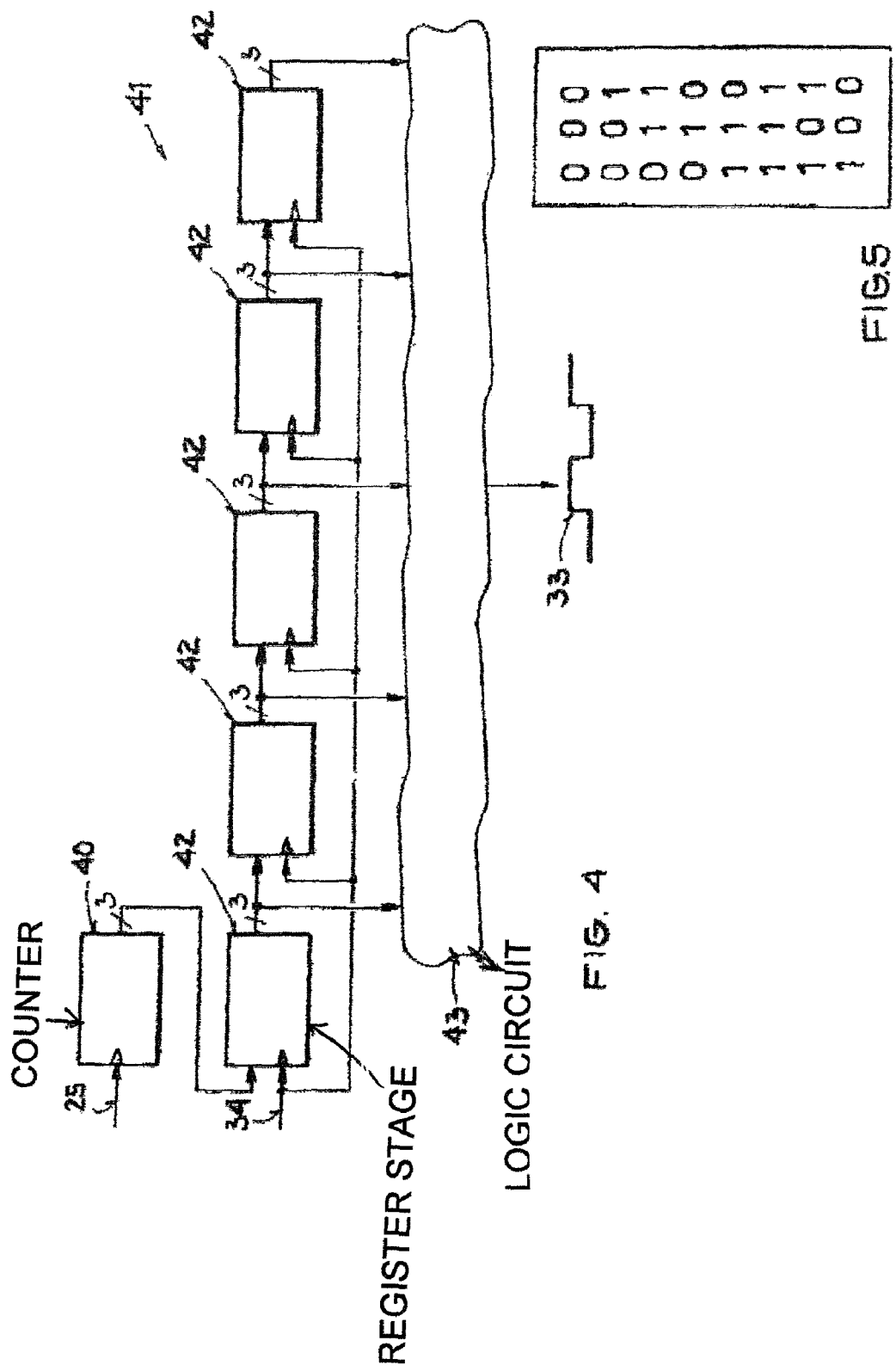

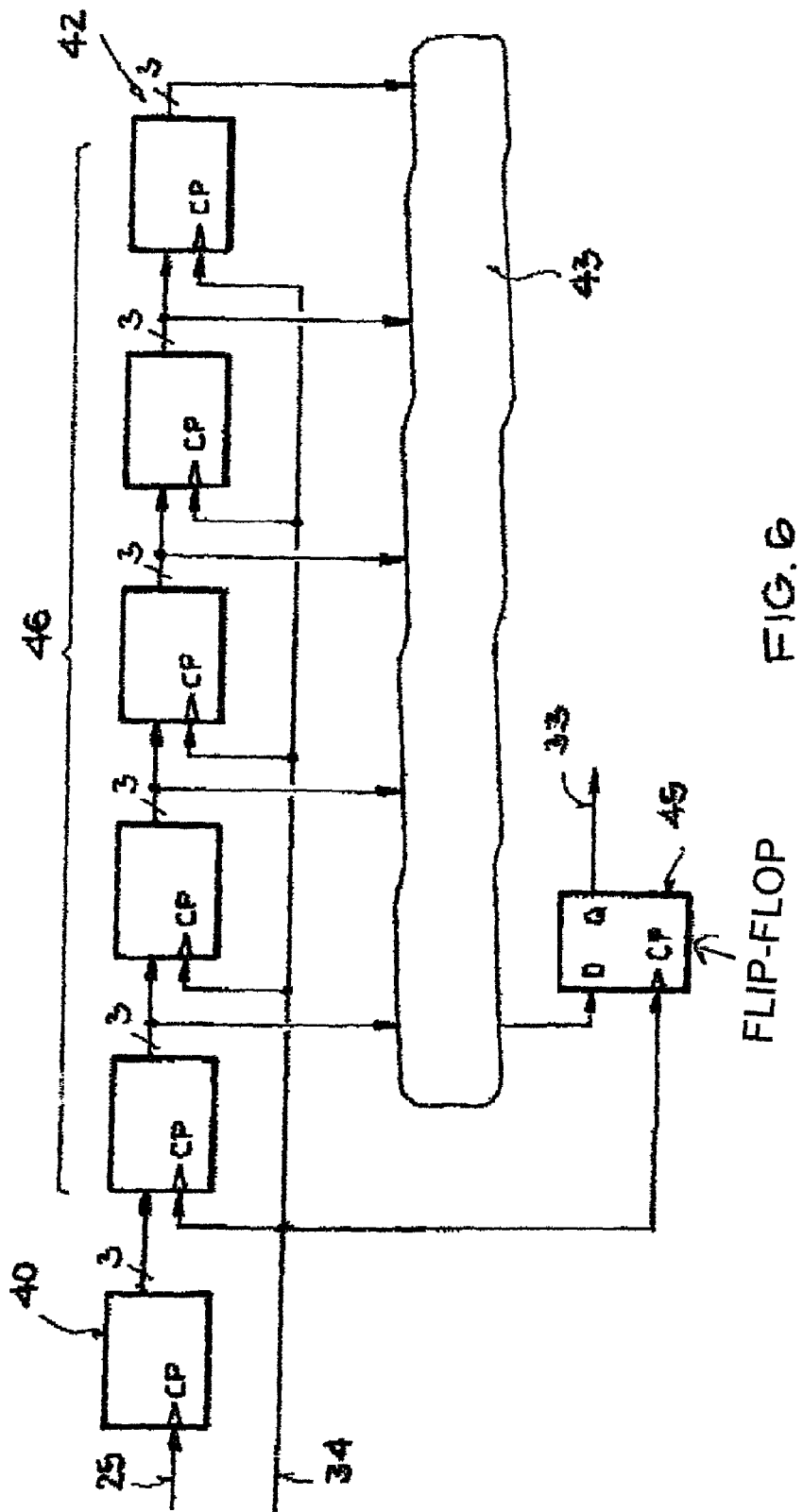

WHEEL ELECTRONICS AND TIRE CONTROL SYSTEM FOR MEASURING A MEASURAND

This nonprovisional application claims priority to German Patent Application No. DE 10 2007 021 859.3, which was filed in Germany on May 10, 2007, and to U.S. Provisional Application No. 60/924,343, which was filed on May 10, 2007, and which are both herein incorporated by reference.

BACKGROUND OF THE INVENTION

1. Field of the Invention

The present invention relates to wheel electronics in or for a tire control system of a vehicle for measuring a measurand and to a tire control system of this type.

2. Description of the Background Art

The present invention relates to systems for monitoring or determining tire-specific parameters, such as tire temperature, tire pressure, the rotational speed of a wheel, the profile thickness, etc. Systems of this type are generally called tire information systems, tire control systems, or also tire pressure control systems. The invention and its underlying problem are described hereinafter with reference to a tire pressure control system, but accordingly without limiting the invention.

Because vehicle safety and reliability are key factors in automotive technology, the tire pressure of vehicles must be checked regularly for safety-related reasons alone. This is frequently neglected. For this reason, modern motor vehicles have, inter alia, tire pressure control systems, which automatically measure tire pressure and are intended to detect early a critical deviation of the measured tire pressure from a desired tire pressure value. A manual check thus becomes unnecessary.

This type of tire pressure control system typically has at least one wheel electronics, assigned to a specific wheel, with a wheel sensor contained therein. This type of wheel sensor is designed to pick up a tire-specific parameter of a wheel assigned in each case to said wheel sensor and to transmit information derived from this measured value. The wheel sensor is integrated, e.g., into the rubber material of the tire; for example, it is vulcanized into the tire rubber. For the initial evaluation and relaying of the picked up information to be sent, the wheel electronics have a transmit antenna over which the information is transmitted. On the vehicle side, the tire pressure control system has at least one receiving device, which picks up the signals transmitted by the tire electronics with the information contained therein and relays them to a central arithmetic logic unit.

A typical bidirectional data communication occurs between respective wheel electronics and the vehicle-side receiving device assigned to it. In said bidirectional data communication, which occurs, for example, according to a known challenge-response method, the vehicle-side base station first sends a request signal (challenge) to the wheel electronics via a transmitting device and the wheel electronics sends back a response signal (response) to this request.

A general problem in tire pressure control systems results from the wireless communication between the wheel electronics and vehicle, which necessitates a local power supply on the part of the wheel electronics. In many tire pressure control systems, the wheel electronics is therefore equipped with a battery or an accumulator. To assure the lowest possible power consumption and thus to spare the tire electronics battery, measurement in the measuring sensor is not continuous but occurs in response to the appropriate request. For this purpose, the base station sends a command (i.e., request) for air pressure measurement to the wheel electronics.

The wheel electronics prompts the wheel sensor to make a measurement, provided it recognizes the command as such.

Because of the wireless transmission path between the vehicle-side transmitter and wheel-side receiver, transmission errors can occur with the transmitted request signal, however. For example, interfering pulses and signal dips can occur in the request signal. Interfering pulses can be caused, for example, by other signal sources, for example, by transmitting devices from other traffic participants in the immediate vicinity of the tire pressure control system, or perhaps also by other radio signals, which are superimposed by the transmitted request signal and interfere with said signal. Moreover, such interfering signals can also arise due to signal sources within the vehicle and be superimposed by the request signal in an undesirable way. Signal dips, in contrast, arise, for example, when the wireless interface is interrupted between the vehicle-side transmitter and the wheel-electronics-side receiver at least at times or in sections. These signal dips can occur when, for example, the tire pressure is to be measured at high speed. In this case, the wheel sensor attached to the tire has only little time to establish data communication with the vehicle-side transmitter/receiver and to perform a data communication. In addition, the body of the vehicle itself can also function at least partially or in sections as a screen for the transmitted request signal.

If a request signal is subject to more or less intense signal dips or interfered with by interfering pulses, a request in the request signal can then not be recognized as such. As a result, this means that the measuring sensor cannot perform any tire pressure measurement. This is a situation that should be avoided as much as possible during tire pressure measurement particularly for safety-related reasons.

SUMMARY OF THE INVENTION

It is therefore an object of the present invention to at least to reduce in a tire control system the effect of interfering pulses and/or signal dips on the measurement of the measurand to be measured.

In an aspect of the invention, provided are wheel electronics in or for a tire control system of a vehicle for measuring a measurand, having a processing/evaluation device for decoding a received amplitude-modulated request signal, which has a carrier frequency trough which the request signal is checked for the presence of a request contained therein, and having a digital counter that has a counter input for coupling the request signal. The wheel electronics may further include a shift register that is connected on an input side with a output of a counter, and whereby an output of the shift register is connected with a logic circuit.

In an embodiment of the tire control system in or for a vehicle, having a vehicle-side base station, which has at least one first transmitting/receiving device, at least one wheel electronics is provided that may have, in each case, a second transmitting/receiving device, whereby to determine tire-specific parameters, data communication between the base station and the wheel electronics is provided in a wheel electronics according to the challenge-response method.

The invention proceeds from a tire control system, which operates according to a challenge-response method, in which the tire electronics and here particularly the measuring sensor thereof performs a measurement only when this is commanded by the base station by means of an appropriate request signal over a wireless communication path to the tire electronics. The request is transmitted by an amplitude-modulated request signal. In an aspect of the invention, the frequency of the carrier signal can be 125 kHz. The information can be modulated onto the carrier signal by, for example, modulation of the amplitude of the carrier signal, e.g. by pulse width modulation.

The idea underlying the present invention is to generate an envelope for this carrier signal and in this manner to decode the respective request from the envelope. The amplitude-modulated request signal is digitized to form said envelope. The idea underlying the present invention further is to supply said digitized request signal to a digital counter, which detects the envelope. For this purpose, the counter is clocked by a clock signal whose frequency is at least different from the carrier signal frequency. In this way, the envelope of the amplitude-modulated request signal can be determined in a very simple, yet very effective way. The present invention therefore creates a digital filter to a certain extent, which during use of, for example, a 90-kHz clock signal filters interfering pulses and signal dips very effectively out of the amplitude-modulated request signal.

In a very surprising way, in this case, interfering signals and signal dips, which are present in the amplitude-modulated request signal and here particularly in the range of the carrier signal thereof, can be avoided by the formation of the envelope. By providing a digital counter to detect the envelope, a digital filter is created to a certain extent, which averages out minor disturbances or signal dips in the high-frequency carrier signal by averaging and thus eliminates them. In this way, moreover, a relatively interference-immune method can be provided very simply to detect a request from a request signal.

In an embodiment, the counter can be a Gray counter. Because the Gray counter always changes only by one bit per clock when counting up, thereby in a very advantageous manner, an especially stable behavior of the filter arrangement of the invention results.

In an embodiment, the counter is formed as a 3-bit counter and here particularly as a 3-bit Gray counter. Eight possible states result overall from these 3 bits. It has become evident that these 3 bits and the thereby possible 8 states are often already sufficient to assure a high noise immunity. It would also be conceivable, of course, to provide only a 2-bit counter or a more than 3-bit counter, depending on the nature of the expected interfering signals and/or signal dips or which noise immunity is to be provided by the wheel electronics of the invention.

In an embodiment, a shift register is provided which is connected on the input side to a counter output of the counter. Preferably, in this case, the shift register is formed as a multistage shift register, which has several shift register cells arranged in series to one another. Preferably, in this case, the shift register is formed as a five-stage shift register and thereby contains a total of five shift register cells. The five-stage shift register therefore has a maximum of five shift register outputs. Depending on the application, one or another output of the shift register cells, for example, the first output provided immediately after the first shift register cell, can also be omitted. The provision of a shift register of this type makes it possible to avoid even the shortest interfering signals and signal dips. The provision of the shift register simultaneously generates at the output of the shift register the envelope, which is slightly time-delayed to the amplitude-modulated request signal; however, this is not another interfering factor, because the envelope of the amplitude-modulated request signal can be generated as a result with high reliability and noise immunity. Depending on the length of the shift register, i.e., depending on the number of shift register cells arranged one after another, the interference sensitivity that the wheel electronics should have can be determined. A very good compromise between the dynamics for generating the envelope and interference immunity is the provision of more than three and less than seven shift register cells and particularly five shift register cells. A higher shift register number is indeed possible but as a result the digital signal or envelope shifts relative to the carrier frequency signal. A higher shift register number also leads to a higher wheel electronics cost. It is possible by means of the shift register that a series of pulses of the carrier frequency must follow one another, otherwise the shift register circuit recognizes that an interfering pulse has caused a missing signal.

In an embodiment, a measuring sensor is provided which performs a measurement of the physical measurand to be determined only when there is a request. The measuring sensor is designed to determine the tire pressure, the tire temperature, or other tire-specific parameters, such as, e.g., the rotational speed of the wheel, tire section thickness, and the like.

In another embodiment, a second evaluation circuit is provided, which is formed so that each output terminal of the shift register and thereby each output terminal of a specific shift register cell are connected to an input of the evaluation circuit. Said second evaluation circuit can be formed, for example, as a logic circuit or also be implemented as a component of the microcontroller. The second evaluation circuit is formed in such a way that it generates a respective logic level depending on the clock signal clock frequency and the output bit detected by the different shift register cells on the output side. In this case, the second evaluation circuit at its output terminal outputs a first logic level, for example, a logic "0" or a low logic level, when all shift register cells have the same output value. Conversely, the second evaluation circuit on the output side outputs a second logic level, for example, a logic "1" or a high logic level, when all output values of the shift register cells are different at least in part. Of course, the reverse logic is also conceivable here.

Typically, the shift register and therefore the shift register cells thereof are clocked by the clock signal.

In an embodiment, a flip-flop and here particularly a D flip-flop are provided whose data input is connected to the output terminal of the second evaluation circuit and into whose clock input the clock signal is coupled. Triggering therefore occurs at the output of this flip-flop by the clock signal by linkage of the output signal of the second evaluation circuit and the envelope clock signal.

In an embodiment, a program-controlled device is provided, which contains at least the function of the first evaluation device. In addition or alternatively, it can also be provided that said program-control device comprises the function of the second evaluation device and/or the counter and/or the flip-flop. Said program-control device can be formed as a microcontroller, microprocessor, or the like or also be implemented as a hardwired logic circuit, such as, e.g., as a PLD or FPGA.

In another embodiment, the wheel electronics contains a local power supply, which supplies the elements of the wheel electronics with power. In particular, this power supply, which can be formed, for example, as a battery or as a chargeable accumulator, supplies the microcontroller, the measuring sensor, the evaluation devices, counter, and the flip-flop of the wheel electronics with power.

In an embodiment of the tire control system of the invention, a carrier signal frequency of the amplitude-modulated request signal sent by the vehicle-side first transmitting/receiving device to the wheel electronics is within the shortwave frequency range. This frequency results in lower interference in other motor vehicle systems, which is relatively important in a motor vehicle.

The frequency of the wheel electronics clock signal can be at least lower than the carrier signal frequency. The tire control system of the invention operates very reliably when the frequency of the wheel electronics clock signal is, for example, at least half of the carrier signal frequency of the amplitude-modulated request signal transmitted by the first transmitting/receiving device to the wheel electronics. Preferably, the carrier signal frequency is 125 kHz and the clock signal frequency 90 kHz.

The Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 3 shows a signal timing diagram of an amplitude-modulated request signal with the carrier signal modulated thereupon, the envelope of the amplitude-modulated signal, and the clock signal;

FIG. 4 shows a circuit arrangement comprising a Gray counter, a shift register arrangement, and a D flip-flop to explain a first exemplary embodiment for a wheel electronics of the invention;

FIG. 5 shows a coding scheme for the possible output states of the Gray counter;

FIG. 6 shows a circuit arrangement comprising a shift register arrangement, a logic circuit, and a flip-flop.

DETAILED DESCRIPTION

Figure 1:
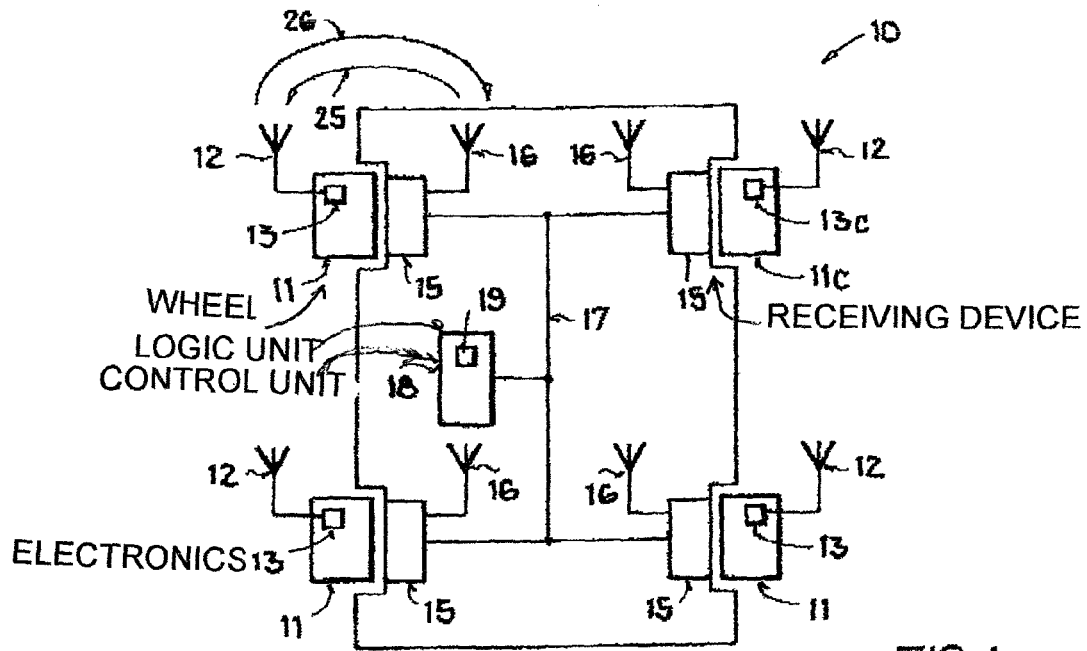
FIG. 1 shows a schematic top plan view of a passenger vehicle to explain the tire pressure control system of the invention.

In the figures of the drawing, the same and functionally identical elements, features, and signals, if not specified otherwise, are provided with the same reference characters.

Using a schematic top plan view of a passenger vehicle, FIG. 1 shows an embodiment of a tire pressure system of the invention. In FIG. 1, reference character 10 designates the vehicle, for example, a passenger vehicle. Vehicle 10 in the present exemplary embodiment has four wheels 11. Each wheel 11 is attached in a known manner to an axle not shown here.

Vehicle 10 has a tire control system of the invention, which in the present exemplary embodiment is designed as a tire pressure control system for determining, for example, the tire pressure. In addition, this tire pressure control system is also designed to evaluate the thus determined information on tire pressure and optionally to display it. This tire pressure control system has wheel-side electronic wheel devices, called wheel electronics hereafter, vehicle-side transmitting/receiving devices, a bus, and a control device. These elements of the tire pressure control system and the arrangements and functions thereof are explained hereafter:

Each individual wheel 11 is assigned at least one wheel electronics 13. Said wheel electronics 13 can be disposed in a manner known per se, for example, within a respective tire, therefore in the rubber material thereof, and/or in the area of the valve or the rim of wheel 11. A particular wheel electronics 13 may include a wheel sensor, which is designed to determine wheel-specific parameters, such as, e.g., tire pressure, tire temperature, the rotational speed of a wheel, the tire section depth, and optionally other parameters as well. Wheel electronics 13 further comprises a transmit/receive antenna 12.

Figure 2:
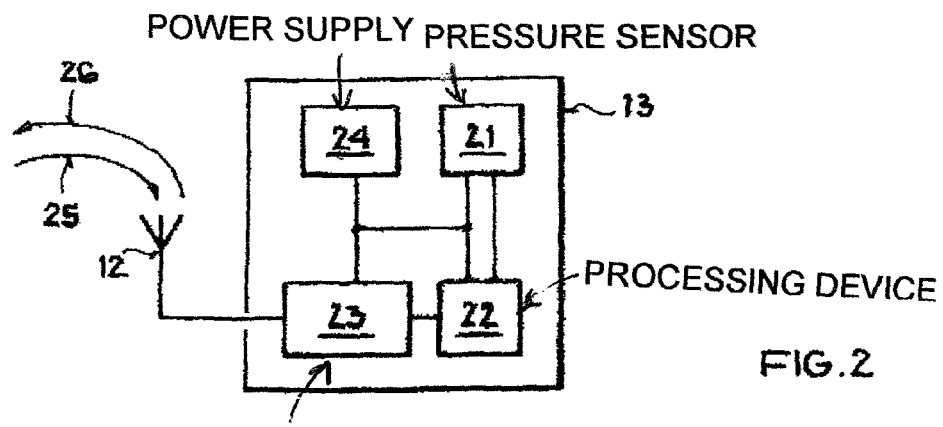
FIG. 2 shows a block diagram of an exemplary layout of a wheel electronics.

Using a schematic block diagram, FIG. 2 shows a layout of wheel electronics 13 of this type. Wheel electronics 13 in the case of the present exemplary embodiment has a pressure sensor 21, a processing/evaluation device 22 connectable to pressure sensor 21, and a transmitting/receiving circuit 23 connectable to processing device 22. These may be supplied with electric power from a local power supply 24, for example, an accumulator or a battery, or for example, via backscattering. The wheel electronics 13 is provided to measure the current tire pressure of the respective wheel by means of pressure sensor 21.

Wheel electronics 13 is provided to pick up an amplitude-modulated signal 25, transmitted on the vehicle-side, via transmit/receive antenna 12 and transmitting/receiving circuit 23 and to relay it to the processing device. Demodulation, decoding, and evaluation of the received signal occur in processing device 22. For example, the signal picked up by wheel electronics 13 contains a request encoded in the amplitude-modulated signal. Processing device 22 determines from the received amplitude-modulated signal the request contained therein, as will be described in detail hereafter.

Processing device, e.g. evaluation device, 22 is provided, inter alia, to generate a message (i.e., response) as transmit signal 26, e.g., about the measured tire pressure and then to transmit this message by means of transmitting/receiving circuit 23 and antenna 12 wirelessly as a response to a vehicle-side receiving device 15.

To receive the wheel-side transmitted transmit signals 26, the tire pressure control system on the vehicle side has several receiving devices 15, each of which comprise a transmit/receive antenna 16. Transmit signal 26 picked up by transmit/receive antenna 16 via receiving device 15 is supplied via an internal bus 17 to a central control unit 18, which has an arithmetic logic unit 19, for example, a device formed as a microcontroller. The evaluation of the message sent by a respective wheel electronics 13 may occur in this arithmetic logic unit 19.

Pressure sensor 21 measures a tire pressure only when it receives an appropriate request. Otherwise, pressure sensor 21 is deactivated. To activate pressure sensor 21, central control unit 18 generates a request signal 25, which contains the request, and sends this request signal 25 via transmitting/receiving device 15 and transmit/receive antenna 16 to wheel electronics 13 assigned to it, which picks up request signal 25 over its transmit/receive antenna 12.

This request signal 25 is, e.g., an amplitude-modulated signal having a 125-kHz carrier frequency in sections. Using a signal timing diagram, FIG. 3 shows an example of curves of this type of amplitude-modulated request signal 25. This request signal 25 has first sections 30 and second sections 31. The first sections of request signal 25 are superimposed by a carrier signal 32, whereas the second sections have no carrier signal 32. Carrier signal 32 in the present case is a high-frequency, for example, 125-kHz carrier signal. The length of the first and second sections and/or their distances to one another contain the coded information and thereby the request information contained in amplitude-modulated request signal 25.

FIG. 3 furthermore shows the envelope signal 33 resulting from the amplitude-modulated signal, which in brief is also called the envelope 33 of the amplitude-modulated request signal 25 hereafter. Further, a clock signal is also shown in FIG. 3, in the present case a 90-kHz clock signal, which is provided internally in wheel electronics 13. An interfering pulse 35 and a signal dip 36 in amplitude-modulated signal request 25 or its carrier signal 32 are shown only by way of example in FIG. 3. As will still be described in detail hereafter, these interferences 35, 36 are filtered out by means of the present invention, so that these interferences 35, 36 are no longer visible in envelope 33, generated as taught by the invention, of the amplitude-modulated request signal 25. This is described in detail hereafter using exemplary circuitry embodiments, which are implemented in wheel electronics 13.

FIG. 4 shows an exemplary embodiment of the feature of generating the envelope 33 as taught by the invention from the amplitude-modulated 125-kHz request signal 25. A decoding of the signal may be performed in the processing device 22. According to the invention, a counter 40 is provided, which is preferably made as a Gray counter. The amplitude-modulated 125-kHz request signal 25 is applied at its counter input. Its output during counting up always changes only by 1 bit per clock, whereby the clock is the carrier frequency. Preferably, Gray counter 40 is made as a 3-bit counter. The bit sequence of the Gray counter is illustrated in FIG. 5, whereby eight logic states are illustrated. The binary counter output of counter 40 has three outputs that are connected to a shift register 41 having five register stages 42. Each register stage 42 may be formed by three parallel flip flops. Each register stage 42 of the shift register 41 has three outputs, corresponding to the three outputs of the counter 40, whereby the three outputs of each of the register stages 42 are provided to a subsequent register stage 42, whereby the register stage 42 may be a D-Flip flop that is edge triggered. In FIG. 4, the three outputs are denoted by the number "3." Shift register 41, which may have 15 flip flops, can be clocked by a 90-kHz clock signal 34. The counter result of Gray counter 40, therefore its current counter state, is thus shifted practically one after another, therefore bitwise in each of the register stages 42 of the shift register 41, and runs through it bitwise.

In particular, shift register 41 is made as a five-stage shift register 41, whereby five shift register stages 42 are present in FIG. 4 by way of example. Each of the three outputs of each of the register stages 42 is connected to a logic circuit 43. So that the flip flops of the register stages 42 are triggered independently of the 125 KHz input signal 25, the three outputs of the gray counter 40 are outputted and shifted through the shift register 41 so long as the 90 KHz clock is provided to an input CP of the flip flops of the register stages 42, as shown in FIG. 6. Referring to FIG. 3, if in the first section 30 an input signal 25 is provided to the input of the gray counter 40, the bit values of the output of the gray counter 40 is continuously changed and thereby also the bit values of the input and outputs of the flip flops of each of the register stages 42, e.g. the bit values are shifted through each of the register stages 42. Accordingly, the bit values on the individual outputs of the flip flops of the register stage 42 are not changed in the second section 31 shortly after the start of section 31. That is, the register stages 42 are, for example, filled with the bit value "0." Via the logic circuit 43, the bit values of each of the register stages 42 are evaluated. If there are a plurality of logic 1's the logic circuit 43 provides a logic value of "1." Otherwise, the logic circuit 43 provides a "0." The logic circuit 43 can be an asynchronous circuit or any circuit known to one skilled in the art, so long as the value of "1" is provided at the output of the logic circuit 43 when a plurality of 1's are provided at an input from the flip flops of the register stages 42. Accordingly, individual interfering pulses 35 or signal dips 36 are filtered to thereby reduce possible signal errors.

In another aspect, when the value (i.e., bits) at the outputs of all shift register stages 42 is the same overall, logic circuit 43 outputs a "0." However, when the values at the outputs of each shift register stage are different, logic circuit 43 then outputs a "1."

As illustrated in FIG. 4, logic circuit 43 at its output outputs desired envelope 33, which results from the logic level at the output of logic circuit 43. This embodiment, can contrast to a decimal counter, therefore can have a maximum of a one 1-bit error.

It is provided in FIG. 6 that the output of logic circuit 43 is connected to a D flip-flop 45, which is clocked by the 90-kHz clock 34. In the shown example, the amplitude-modulated 125-kHz signal clocks Gray counter 40 in a practical way. Its values are taken to five-stage shift register 41. If all values of shift register 41, i.e., all output bits of the different shift register stages 42, are the same, the envelope is "0", and if they are different, the envelope is "1." This circuit itself filters out individual needle-shaped interfering signals 35 and clock dips 36, which is not possible in conventional digital filters.

Figure 7:
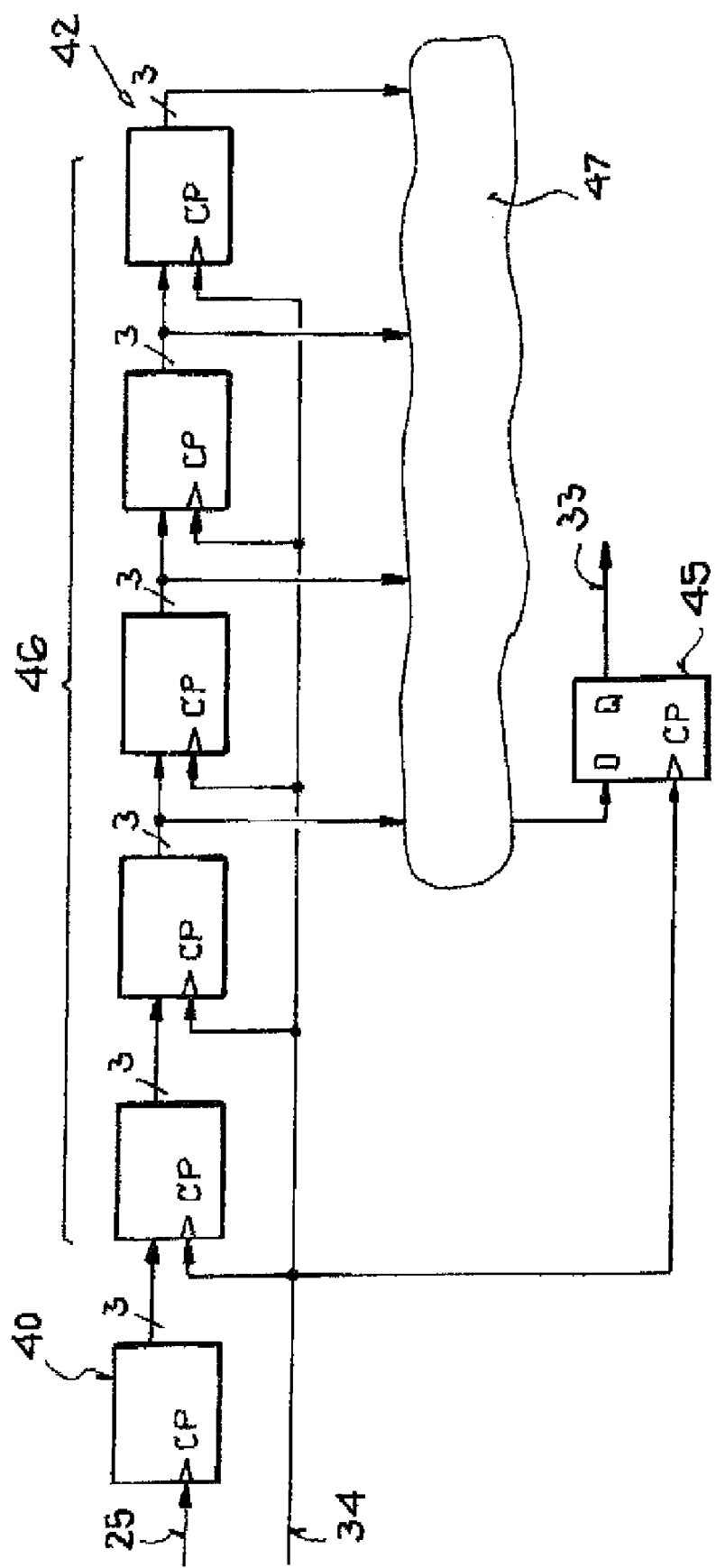
FIG. 7 shows a circuit arrangement comprising a shift register arrangement, a logic circuit, and a flip-flop.

In another aspect of the invention, as shown in FIG. 7, only the last three (3) outputs of the last 4 register stages 42 of the sift register 46 are connected to a logic circuit 47, which may be an asynchronous logic circuit. Hereby, the logic circuit 47 can function in a more energy efficient manner and also requires less space. The logic circuit 47 only analyzes the last four of the five register stages 42. Preferably, when the same values, for example "0", are at an output of the register stages 42, the envelope 33, which is provided from an output of flip flop 45, is set to a "1" when several different values are determined in the register stages 42.

Although the present invention was described heretofore with use of preferred exemplary embodiments, it is not limited thereto, but understandably can be modified in various ways. The invention is not only not restricted to the described exemplary embodiment, but can also be used in other measuring systems for measuring other physical parameters. It also need not be used in a motor vehicle, but other measurand transmissions in other environments affected by interferences are also possible.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A wheel electronic for a tire control system of a vehicle for measuring a measurand, the wheel electronic comprising:
   a transmitting/receiving device for receiving at least an amplitude-modulated request signal; and
   an evaluation device for decoding the request signal and for generating an envelope signal from the decoded request signal, the evaluation device comprising:
   a counter that has an input for receiving the request signal;

a shift register for receiving an output from the counter, the shift register having a plurality of register stages; and a logic circuit for receiving an input from at least one register stage of the shift register and for providing an output representing a decoded value of the request signal provided to the transmitting/receiving device.

2. The wheel electronic according to claim 1, wherein the counter is a Gray counter.

3. The wheel electronic according to claim 1, wherein the counter is a 3-bit counter.

4. The wheel electronic according to claim 1, wherein each register stage of the shift register has a plurality of flip flops, and wherein each output of the counter is connected with an input of each of the flip flops.

5. The wheel electronic according to claim 1, wherein the shift register is a multistage shift register and has a plurality of shift register stages arranged in series to one another.

6. The wheel electronic according to claim 1, wherein the shift register has five register stages, each of the register stages having an output to thereby provide a value to the logic circuit.

7. The wheel electronic according to claim 1, wherein a clock signal of the shift register has a different frequency than a carrier frequency of the request signal.

8. The wheel electronic according to claim 1, wherein at least one of the register stages of the shift register is connected to the logic circuit and wherein the logic circuit at an output terminal outputs a first logic level, when substantially all shift register stages have the same output value, and which outputs a second logic level, when the output values of the shift register steps are different.

9. The wheel electronic according to claim 7, wherein an output of the logic circuit has the same clock frequency as the clock signal of the shift register.

10. The wheel electronic according to claim 1, wherein a flip-flop or a D flip-flop, is provided, whose data input is connected to an output terminal of the logic circuit.

11. The wheel electronic according to claim 1, further comprising a power supply for providing the wheel electronic with power.

12. The wheel electronic according to claim 1, further comprising a pressure sensor for measuring a pressure value of a vehicle wheel.

13. The wheel electronic according to claim 1, wherein the output representing a decoded value of the request signal is used to switch a pressure sensor from an off state to an on state.

* * * * *